(12) United States Patent
Ring et al.

(10) Patent No.: US 6,372,529 B1
(45) Date of Patent: *Apr. 16, 2002

(54) FORMING ELONGATED PROBE POINTS USEFUL IN TESTING SEMICONDUCTOR DEVICES

(75) Inventors: Rosalinda M. Ring; Rama R. Goruganthu; Brennan V. Davis; Jeffrey D. Birdsley; Michael R. Bruce, all of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/408,616

(22) Filed: Sep. 30, 1999

(51) Int. Cl.[7] .......................... G01R 31/26; H01J 37/08
(52) U.S. Cl. ..................... 438/18; 250/492.21; 438/17
(58) Field of Search ............................. 257/48; 438/14, 438/15, 17, 18, 597; 324/512, 522, 523; 250/492.1, 492.2, 492.21, 492.3, 251; 204/192.1, 192.11, 192.32, 192.33, 192.34

(56) References Cited

U.S. PATENT DOCUMENTS

| 5,976,980 A | * | 11/1999 | Livengood et al. |
| 5,990,562 A | * | 11/1999 | Vallett |
| 6,171,944 B1 | * | 1/2001 | Li et al. |
| 6,193,859 B1 | * | 2/2001 | Contolini et al. |

* cited by examiner

Primary Examiner—Charles Bowers
Assistant Examiner—Evan Pert

(57) ABSTRACT

Access to portions of semiconductor devices is enhanced via a method and system for probing between circuitry in the semiconductor device during post-manufacture analysis of the semiconductor device. According to an example embodiment of the present invention, an elongated conductive via probe is formed in a semiconductor device having circuitry in a circuit side opposite a back side. The probe is formed by first removing substrate from the semiconductor device and forming an exposed region over a target node between circuitry in the device. A narrow conductor is then formed for accessing the target node, with the conductor and extending between the circuitry and into the back side and forming the elongated conductive via probe. The probe is accessed and used for analyzing the device. In this manner, access to a difficult-to-reach target node, such as a node between closely-placed transistors, is facilitated.

20 Claims, 2 Drawing Sheets

FORMING ELONGATED PROBE POINTS USEFUL IN TESTING SEMICONDUCTOR DEVICES

FIELD OF THE INVENTION

The present invention relates generally to semiconductor devices, and more particularly, to techniques for analyzing and debugging circuitry within an integrated circuit die.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors, operating at speeds of hundreds of millions of instructions per second to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

As the manufacturing processes for semiconductor devices and integrated circuits increase in difficulty, methods for testing and debugging these devices become increasingly important. Not only is it important to ensure that individual chips are functional, it is also important to ensure that batches of chips perform consistently. In addition, the ability to detect a defective manufacturing process early is helpful for reducing the number of defective devices manufactured.

Traditionally, integrated circuits have been tested using methods including directly accessing circuitry or devices within the integrated circuit. In addition, many methods require the circuit to be powered. Directly accessing the circuitry is difficult for several reasons. For instance, in flip-chip type devices, transistors and other circuitry are located in a very thin epitaxially-grown silicon layer in a circuit side of the die. The circuit side of the die is arranged face-down on a package substrate. This orientation provides many operational advantages. However, due to the face-down orientation of the circuit side of the die, the transistors and other circuitry near the circuit side are not readily accessible for testing, modification, or other purposes. Therefore, access to the transistors and circuitry near the circuit side is from the back side of the chip.

Since access to the transistors and circuitry in flip-chips is generally from the back side of the device, it is often necessary to mill through the back side and probe certain circuit elements in order to test the device. Often, the area between transistors and other circuitry in flip-chip and other integrated circuit dies is very small. Probing points between such circuitry and devices is difficult to achieve without contacting the devices between which the probes are formed and potentially causing damage. This difficulty inhibits the access and probing of circuit areas located between and beneath such circuitry.

SUMMARY OF THE INVENTION

The present invention is directed to a method and system for improving post-manufacturing analysis of a semiconductor device involving providing access to hard-to-reach portions of the circuitry. The present invention is exemplified in a number of implementations and applications, some of which are summarized below.

According to an example embodiment of the present invention, an elongated narrow conductive via probe is formed in a semiconductor device having circuitry in a circuit side opposite a back side. The probe is formed by first removing substrate from the semiconductor device and forming an exposed region over a target node between circuitry in the device. A conductor is formed for accessing the target node and extending between the circuitry and into the back side, and is used for analyzing the device. By forming the conductor between circuitry in the device, access to the target node is facilitated.

According to another example embodiment of the present invention, a system is arranged for forming an elongated narrow conductive via probe for analyzing a semiconductor device having circuitry in a circuit side opposite a back side. The system includes a substrate removal device that is adapted to remove substrate from the back side and to form an exposed region over a target node between circuitry. An ion deposition device is also included and is adapted to form a conductor for coupling to and accessing the target node and extending between the circuitry and into the back side. A testing arrangement is adapted to use the formed conductor and to analyze the device.

The above summary of the present invention is not intended to describe each illustrated embodiment or every implementation of the present invention. The FIGS. and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
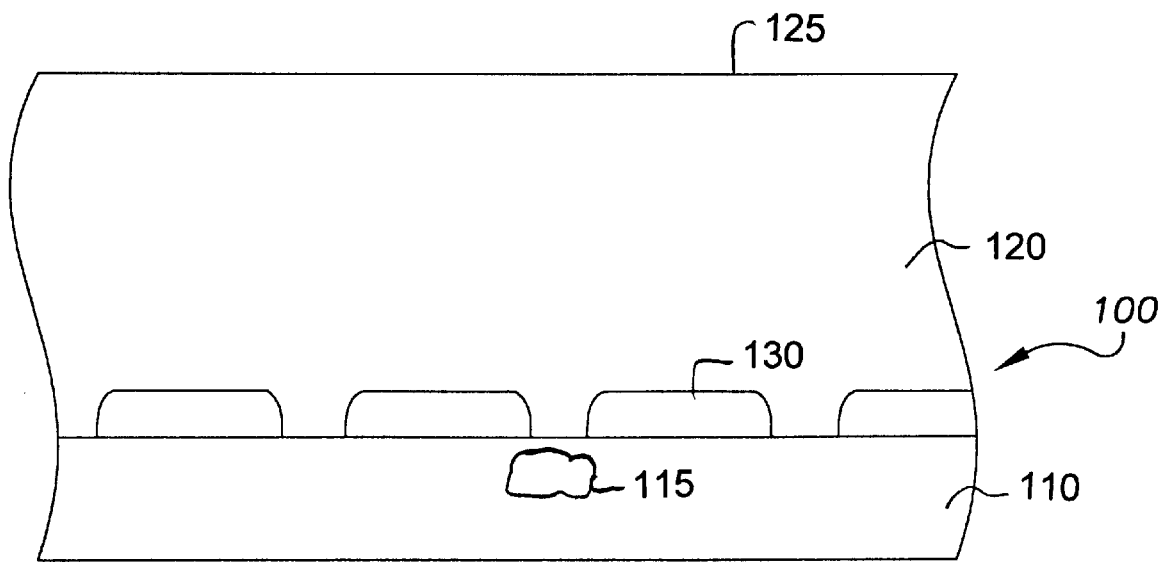
FIG. 1 is a semiconductor device for use in connection with an example embodiment of the present invention.
Figure 2:
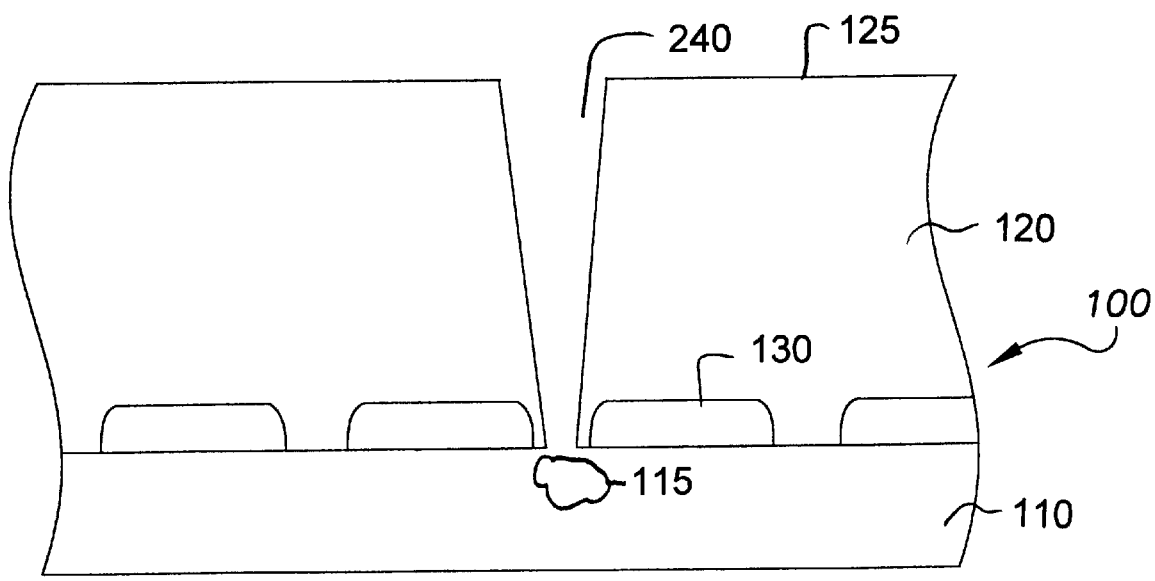
FIG. 2 is the semiconductor device of FIG. 1 having undergone a processing step, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and the invention has been found to be particularly suited for flip-chip and other type devices requiring or benefiting from post-manufacturing analysis involving accessing circuitry within the device. While the present invention is not necessarily limited to such devices and analysis, various aspects of the invention may be appreciated through a discussion of various examples using this context.

In connection with an example embodiment of the present invention, one or more elongated probes formed extending to target circuitry located in difficult-to-reach areas of a semiconductor device have been found to be useful for connecting to the target circuitry and analyzing the device. For example, areas between closely-spaced transistors or in buried layers of circuitry in semiconductor devices can be inaccessible without using such an elongated probe. In addition, even when areas of the device are capable of being reached via a conventional probe or other methods, doing so often can damage surrounding circuitry or be too time-burdensome to be useful.

Figure 3:
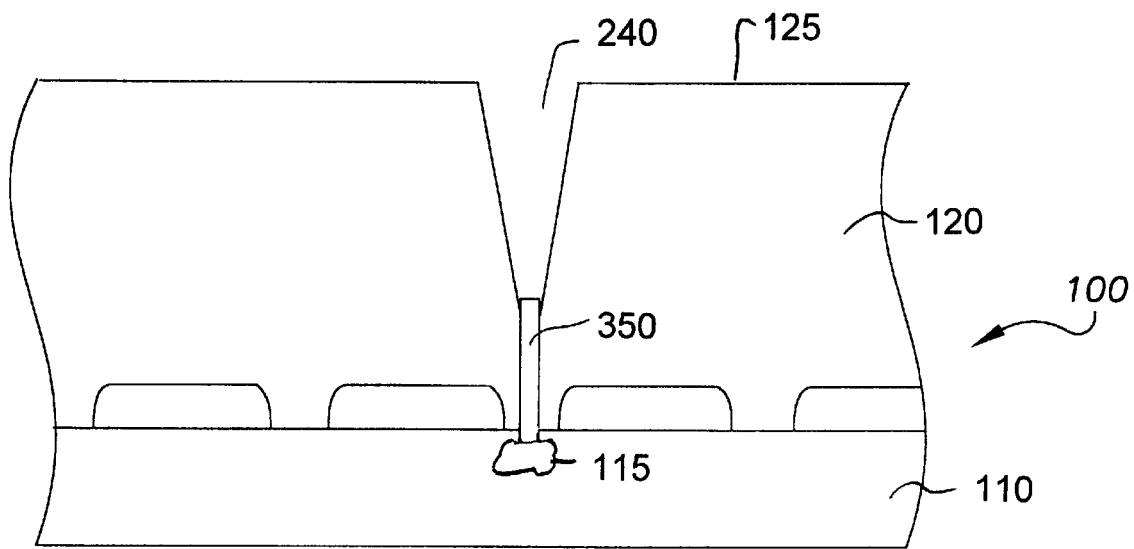
FIG. 3 is the semiconductor device of FIG. 2 having undergone another processing step, according to another example embodiment of the present invention.

FIGS. 1–4 show steps in the formation of an elongated conductive probe, according to an example embodiment of the present invention. FIG. 1 shows a semiconductor device 100 having target circuitry 115 in a circuit side 110 opposite a back side 120, and elements 130 formed within the device. Substrate is removed from the semiconductor device 100 at a back side surface 125 in FIG. 2, and an exposed region 240 is formed over the target circuitry 115. For example, the substrate removal can be accomplished using a FIB or other ion bombardment device, a laser etching device, chemical mechanical polishing, or a combination thereof. An insulated conductor 350 is formed in the exposed region 240 using, for example, Gallium ion implantation. In one implementation, the substrate removal and the formation of the insulated conductor are performed with the same FIB device. The insulated conductor 350 extends from a location adjacent to the target circuitry 115 and between the elements 130, as shown in FIG. 3.

Figure 4:
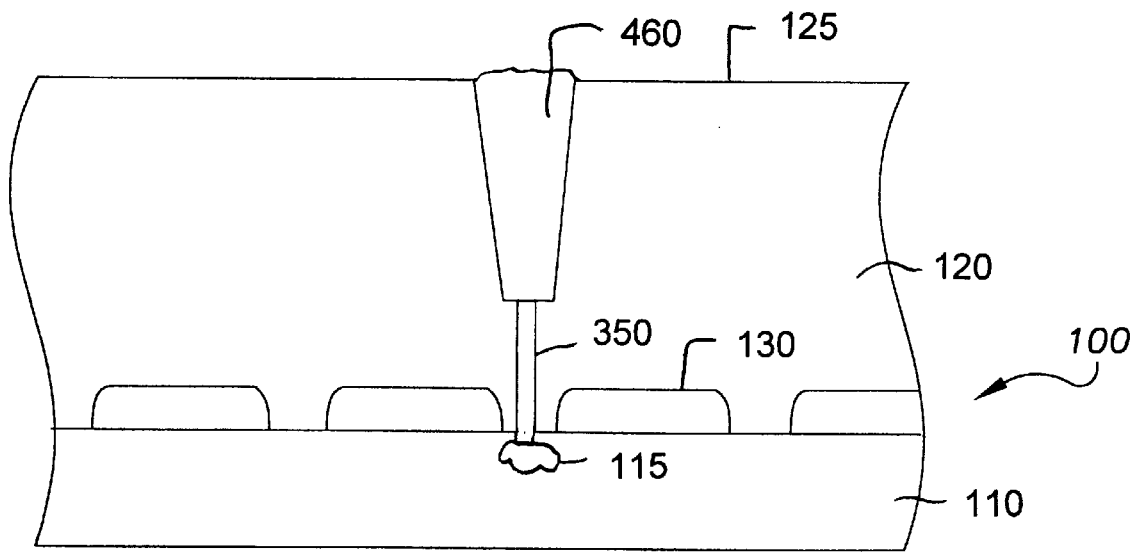
FIG. 4 is the semiconductor device of FIG. 3, having undergone another processing step, according to an example embodiment of the present invention.

The formed insulated conductor 350 is then used to couple to the target circuitry 115. Although FIG. 3 shows the insulated conductor 350 contacting the target circuitry 115, the insulated conductor 350 may also be coupled in other manners, such as via capacitive coupling, or via heat transfer. In addition, the connection to the conductor 350 for analysis can be made in several manners. For instance, one example method for coupling to the insulated conductor 350 is shown in FIG. 4, where conductive material such as a probe 460 has been deposited in the exposed region 240 above the insulated conductor 350. Connection is then made via the deposited conductive material 460. In another implementation, not shown in FIG. 4, the insulated conductor 350 extends to the back side surface 125.

Once connection is made to the target circuitry, stimulation can be added to the target circuitry via the probe. For example, electric signals, heat, or other stimulation can be applied to the target circuitry via the probe. Using similar examples, the probe can also be used to obtain a response from the target circuitry, such as during normal operation or after the target circuitry has been excited. The response during normal operation or to the excitation is detected and used to analyze the device. Such application of stimulation or detection of a response from the target circuitry can involve the use of a variety of typical testing devices, such as a power supply, a test fixture, a computer, a microscope, a signal detection device, a laser.

In another example embodiment of the present invention, the probe is formed by first forming an insulative layer around the walls of the exposed region 240 and depositing conductive material inside the insulative layer. One particular method of forming the conductor includes depositing an insulating material having a conductive core in the exposed region in a single step. This method allows the formation of very narrow, such as submicron width, probes by forming an exposed region having an aspect ratio of at least about 4. For a more detailed explanation of forming such a conductor, reference may be made to co-pending patent application Ser. No. 09/383,790, Ring et al., filed on Aug. 26, 1999, entitled "ARRANGEMENT AND METHOD FOR CHARACTERIZATION OF FIB INSULATOR DEPOSITION", which is assigned to the assignee of the present invention and is incorporated herein by reference. In this manner, the conductor can be deposited using one process for creating both a conductive insulator core and a nonconductive insulator around the core. In addition, the conductor can be deposited using an FIB that is also used to form the exposed region.

Although FIGS. 1–4 show the probe being formed and accessed via the back side surface 125, the probe is formed and accessed in other manners in other example implementations of the present invention. For instance, the probe can be formed via the circuit side 110, and access to the probe can be via either side as applications vary. In addition, the probe can be formed during the manufacture of the device and used for subsequent analysis, or formed after the device has been made and access to target circuitry is desired, such as shown in FIGS. 1–4. In one particular application, the probe is formed during manufacture of the device and extends into the back side, such as shown in FIG. 3. Substrate is then re-formed in the exposed region 240. When access to the probe is desired, substrate is removed to expose the probe and the target region is accessed via the exposed probe. In another particular application, the probe is formed via the circuit side as the die is manufactured and without removing substrate via the back side surface 125. Again, when access to the target circuitry is desired, the probe is accessed by removing substrate and exposing the probe.

Various types of target circuitry can be accessed using the elongated probe point, either by conductive or capacitive coupling. One application for which the elongated probe point is particularly useful is for accessing a target node within a transistor. The present invention is useful for accessing target nodes such as the source and drain regions, target circuitry between the source and drain regions, the metal interconnect, and other circuitry in a semiconductor device. In one particular implementation, the elongated probe has a width of between about 0.5 microns and about 1 micron and is used to probe local interconnects of about 0.5 micron width. Another application involves accessing a target node below shallow trench isolation (STI) regions and between transistors. In addition to facilitating access to such narrowly-spaced regions using the elongated probe point, the small width of the probe point minimizes the capacitive load added to the device by the probe point.

While the present invention has been described with reference to several particular example embodiments, those skilled in the art will recognize that many changes may be made thereto without departing from the spit and scope of the present invention, which is set forth in the following claims.

What is claimed is:

1. A method for forming an elongated conductive via probe for post-manufacture analysis of a semiconductor device having circuitry in a circuit side opposite a back side, the method comprising:

removing substrate from the semiconductor device and forming an exposed region over a target node, the exposed region being between first and second elements;

forming an insulated narrow conductor for accessing the target node and extending between the first and second elements and into the back side; and analyzing the device by using the formed conductor to access the target node.

2. The method of claim 1, wherein the conductor extends through the back side.

3. The method of claim 1, wherein forming a conductor comprises depositing a material in the exposed region over the target node, and using the deposited material to form simultaneously a conductive core and an immediately adjacent insulator.

4. The method of claim 1, wherein the conductor is implanted using a Gallium ion beam.

5. The method of claim 1, wherein using the formed conductor to access the target node includes accessing the target node via at least one of: capacitive coupling and contacting the target node.

6. The method of claim 1, wherein the conductor is between about 0.5 microns and 1 micron wide.

7. The method of claim 1, wherein the conductor extends into an epi region of the die and is coupled to at least one of: a source, a drain, a gate, and a metal interconnect.

8. The method of claim 1, wherein removing substrate from the back side and forming an exposed region over a target node between circuitry includes milling with an aspect ratio of at least about 4.

9. The method of claim 1, wherein using the formed conductor and analyzing the device includes stimulating the device via the conductor.

10. The method of claim 1, wherein using the formed conductor and analyzing the device includes detecting a response from the device via the conductor.

11. The method of claim 1, wherein the conductor is formed as one of a plurality of conductors in a semiconductor device.

12. The method of claim 1, wherein the elongated conductive via probe is formed during the manufacture of the device.

13. The method of claim 12, wherein the conductor ends in the back side, further comprising:

subsequent to manufacturing the device, removing substrate from the back side and exposing the end of the conductor; and accessing the exposed end of the conductor.

14. The method of claim 13, wherein accessing the exposed end of the conductor comprises depositing conductive material on the exposed end of the conductor and extending to the back side and forming a probe, wherein using the formed conductor and analyzing the device includes using the deposited probe to access the formed conductor.

15. A system for forming an elongated conductive via probe for post-manufacture analysis of a semiconductor device having circuitry in a circuit side opposite a back side, the system comprising:

means for removing substrate from the back side and forming an exposed region over a target node between circuitry;

means for forming a narrow conductor for accessing the target node and extending between the circuitry and into the back side; and means for analyzing the device, by using the formed conductor to access the target node.

16. A system for forming an elongated conductive via probe for post-manufacture analysis of a semiconductor device having circuitry in a circuit side opposite a back side, the system comprising:

a substrate removal device adapted to remove substrate from the back side and form an exposed region over a target node between circuitry;

an ion deposition device adapted to form a narrow conductor for accessing the target node and extending between the circuitry and into the back side; and a testing arrangement adapted to analyze the device by using the formed conductor to access the target node.

17. A system, according to claim 16, wherein the substrate removal device includes at least one of: a FIB device, a laser etching device, and a chemical-mechanical polishing device.

18. A system, according to claim 16, wherein the ion deposition device includes a FIB device.

19. A system, according to claim 16, wherein the substrate removal device and the ion deposition device are one and the same.

20. A system, according to claim 16, wherein the testing arrangement includes at least one of: a power supply, a test fixture, a computer, a microscope, and a signal detection device.

* * * * *